US011929703B2

(12) United States Patent
Boncyk et al.

(10) Patent No.: US 11,929,703 B2
(45) Date of Patent: Mar. 12, 2024

(54) SYSTEM AND METHOD FOR CONVERTING AND TRANSMITTING ENERGY

(71) Applicant: Atomos Nuclear and Space Corporation, Denver, CO (US)

(72) Inventors: Wayne C. Boncyk, Evergreen, CO (US); Vanessa Jane Clark, Denver, CO (US); Lucas Brady Beveridge, Denver, CO (US)

(73) Assignee: Atomos Nuclear and Space Corporation, Denver, CO (US)

( * ) Notice: Subject to any disclaimer, the term of this patent is extended or adjusted under 35 U.S.C. 154(b) by 0 days.

(21) Appl. No.: 17/691,876

(22) Filed: Mar. 10, 2022

(65) Prior Publication Data
US 2022/0294382 A1 Sep. 15, 2022

Related U.S. Application Data

(60) Provisional application No. 63/159,381, filed on Mar. 10, 2021.

(51) Int. Cl.
*H02S 10/30* (2014.01)
(52) U.S. Cl.
CPC .................... *H02S 10/30* (2014.12)
(58) Field of Classification Search
CPC .................................................. H02S 10/30
See application file for complete search history.

(56) References Cited

U.S. PATENT DOCUMENTS

| 8,710,353 | B2 | 4/2014 | Shepard |
| 9,829,435 | B2 | 11/2017 | Lu et al. |
| 2009/0314333 | A1* | 12/2009 | Shepard .............. H01L 31/0549 385/27 |
| 2010/0282242 | A1 | 11/2010 | Gilon et al. |
| 2012/0312343 | A1 | 12/2012 | VanVechten et al. |
| 2015/0338402 | A1 | 11/2015 | Lakowicz et al. |
| 2017/0152550 | A1 | 6/2017 | Hiddessen et al. |

FOREIGN PATENT DOCUMENTS

| WO | WO-2012138651 A2 * | 10/2012 | .......... H01L 25/047 |
| WO | 2022192570 A1 | 9/2022 | |

OTHER PUBLICATIONS

International Search Report and Written Opinion, PCT/US2022/019799, completed Jun. 20, 2022, dated Jul. 1, 2022.
International Searching Authority; PCT/US2022/109799; Invitation to pay additional fees; dated May 6, 2022.
International Bureau, PCT/US22/19799; Notice of Publication, dated Sep. 15, 2022.
International Bureau, "International Preliminary Report on Patentability for PCT Application No. PCT/US2022/019799," dated Sep. 12, 2023, 8 pages.

* cited by examiner

*Primary Examiner* — Tae-Sik Kang
(74) *Attorney, Agent, or Firm* — Neugeboren O'Dowd PC

(57) ABSTRACT

An energy conversion and transmission system includes a thermal energy converter configured to convert thermal blackbody radiation energy to thermal infrared (IR) energy and to output a thermal IR energy stream. The system further includes a transmission device configured to receive the thermal IR energy stream from the thermal energy converter at a first location and output the thermal IR energy stream at a second location. The transmission device supplies the thermal IR energy stream to a thermal IR energy destination at the second location.

19 Claims, 9 Drawing Sheets

SYSTEM AND METHOD FOR CONVERTING AND TRANSMITTING ENERGY

CROSS-REFERENCE TO RELATED APPLICATIONS

This application benefits from and claims priority to U.S. provisional patent application Ser. No. 63/159,381, filed Mar. 10, 2021, and entitled "System and Method for Converting and Transmitting Energy," the disclosure of which is incorporated herein by reference in its entirety.

TECHNICAL FIELD

Aspects of the present disclosure generally relate to converting and transmitting energy, such as energy conversion and transmission systems and methods for off-earth applications.

BACKGROUND

Efficient generation and transmission of energy harvested from moderate to high temperature thermal sources (such as nuclear reactors) in off-earth applications remains an elusive goal. While current technologies for converting heat energy to electricity and techniques for relatively efficient transmission of that electricity over multi-kilometer distances have been developed for terrestrial power grid systems since early in the 20th century, those existing technologies, when evaluated for application in off-earth (lunar and planetary) environments, suffer from several key disadvantages.

Current electricity transmission either requires large and relatively heavy, highly conductive metallic (e.g., copper or copper clad steel in terrestrial systems) transmission lines, or similarly massive conductive waveguides for efficient radiofrequency (RF) power "beaming." Non-guided RF power beaming, while not incurring the same transmission path mass penalty as traditional (i.e., guided) systems, is significantly less efficient overall after accounting for transmit and receive sidelobe and conversion losses. It also presents potentially major environmental hazards at or near a planetary surface. Personnel or equipment entering a high field-strength RF power beam can suffer Electromagnetic Interference (EMI), which can compromise the ability of electronics to properly function, or even worse, high intensity electromagnetic radiation is a threat to life.

Furthermore, the current systems and approaches for efficient electric power generation directly from sources of moderate to high temperature (700-1200 Kelvins) heat energy require employment of electromechanical (e.g., Stirling, Rankine, or Brayton) mechanisms, which require periodic maintenance and refurbishment to maintain optimal performance. The currently available systems also incur a significant mass penalty to make them resilient to operation in vacuum or near-vacuum environments subject to large changes in ambient temperature. Further, all heat-engine conversion schemas are thermodynamically limited in efficiency. Heat engines depend on a large differential between high and low temperature sources and sinks to work efficiently. Practical Brayton turbines utilizing high to low temperature differentials of 300 Kelvins, for example, typically operate with conversion efficiencies of less than 40%. Subsequent use of the heat engine's mechanical output to drive an electric generator (running at a typical 80 to 90% efficiency) drops the overall conversion efficiency of the best possible Brayton system in this regime to 36 to 38%.

Current solid-state direct thermoelectric conversion technologies are relatively inefficient. Conversion efficiencies of the best existing thermoelectric devices hover in the single digit percentages (i.e., 5-7%), although their solid-state nature and relatively long operational life have made them desirable for interplanetary probes. However, rejection of so much "waste heat" becomes problematic on a planetary surface, where the radiation of unconverted thermal energy can heat the local environment to extremely high temperatures.

The disclosure overcomes the significant limitations of current energy conversion and transmission systems, especially when employed in off-earth space or planetary applications.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an embodiment, an energy conversion and transmission system includes a thermal energy converter configured to convert thermal blackbody radiation energy to thermal infrared (IR) energy and to output a thermal IR energy stream. The system further includes a transmission device configured to receive the thermal IR energy stream from the thermal energy converter at a first location and output the thermal IR energy stream at a second location. The transmission device supplies the thermal IR energy stream to a thermal IR energy destination at the second location.

In another embodiment, a method of converting and transmitting energy includes providing an energy conversion and transmission system. The energy conversion and transmission system includes a thermal energy converter configured to receive thermal blackbody radiation energy, convert the thermal blackbody radiation energy to thermal IR energy, and output a thermal IR energy stream. The energy conversion and transmission system further includes a transmission device configured to receive the thermal IR energy stream from the thermal energy converter at a first location and output the thermal IR energy stream at a second location. The method further includes receiving, by the thermal energy converter from a thermal energy source, thermal blackbody radiation energy; converting, by the thermal energy converter, the thermal blackbody radiation energy to thermal IR energy to produce a thermal IR energy stream; transmitting, by the transmission device, the thermal IR energy stream from a first location to a second location; and supplying the thermal IR energy stream is to a thermal IR energy destination at the second location.

In still another embodiment, An energy conversion and transmission system includes a solar concentrator, a receiver/converter/transmitter (RCT), and a photovoltaic converter (PVC). The solar concentrator is configured for focusing solar energy incident theron on to the RCT. The RCT is configured for receiving the solar energy so focused thereon and converting the solar energy into an infrared beam and transmitting the infrared beam to the PVC. Further, the PVC is configured for converting the infrared beam received from the RCT into electricity.

In an embodiment, the solar concentrator includes at least one of a parabolic trough concentrator, a linear Fresnel collector, and a concentrating dish.

In another embodiment, the RCT incudes an absorber for collecting the soloar energy incident thereon and a selective emitter for converting the solar energy into the infrared beam.

In a further embodiment, the RCT further includes a waveguide for transmitting the infrared beam to the PVC.

In still further embodiment, the PVC includes a plurality of thermal photovoltaic cells exhibiting a bandgap energy wavelength, and a wavelength of the infrared beam is substantially matched to the bandgap energy wavelength.

In another embodiment, the solar concentrator is a parabolic trough concentrator including a focal line, and the RCT is configured as a tube, which tube is mounted at the focal line of the parabolic trough concentrator. In an embodiment, the tube includes a tungsten subtrate supporting an absorber, and the tube further includes an aluminum nitride substrate supporting a reflective coating. In some embodiments, the tube further includes an insulating material. In certain embodiments, the tube is configured to guide the infrared beam toward the PVC.

BRIEF DESCRIPTION OF THE DRAWINGS

The disclosure will be readily understood by the following detailed description in conjunction with the accompanying drawings, wherein like reference numerals designate like elements. The elements of the drawings are not necessarily to scale relative to each other. Identical reference numerals have been used, where possible, to designate identical features that are common to the figures. The appended drawings illustrate only some implementation and are therefore not to be considered limiting of scope.

DETAILED DESCRIPTION

Figure 1:
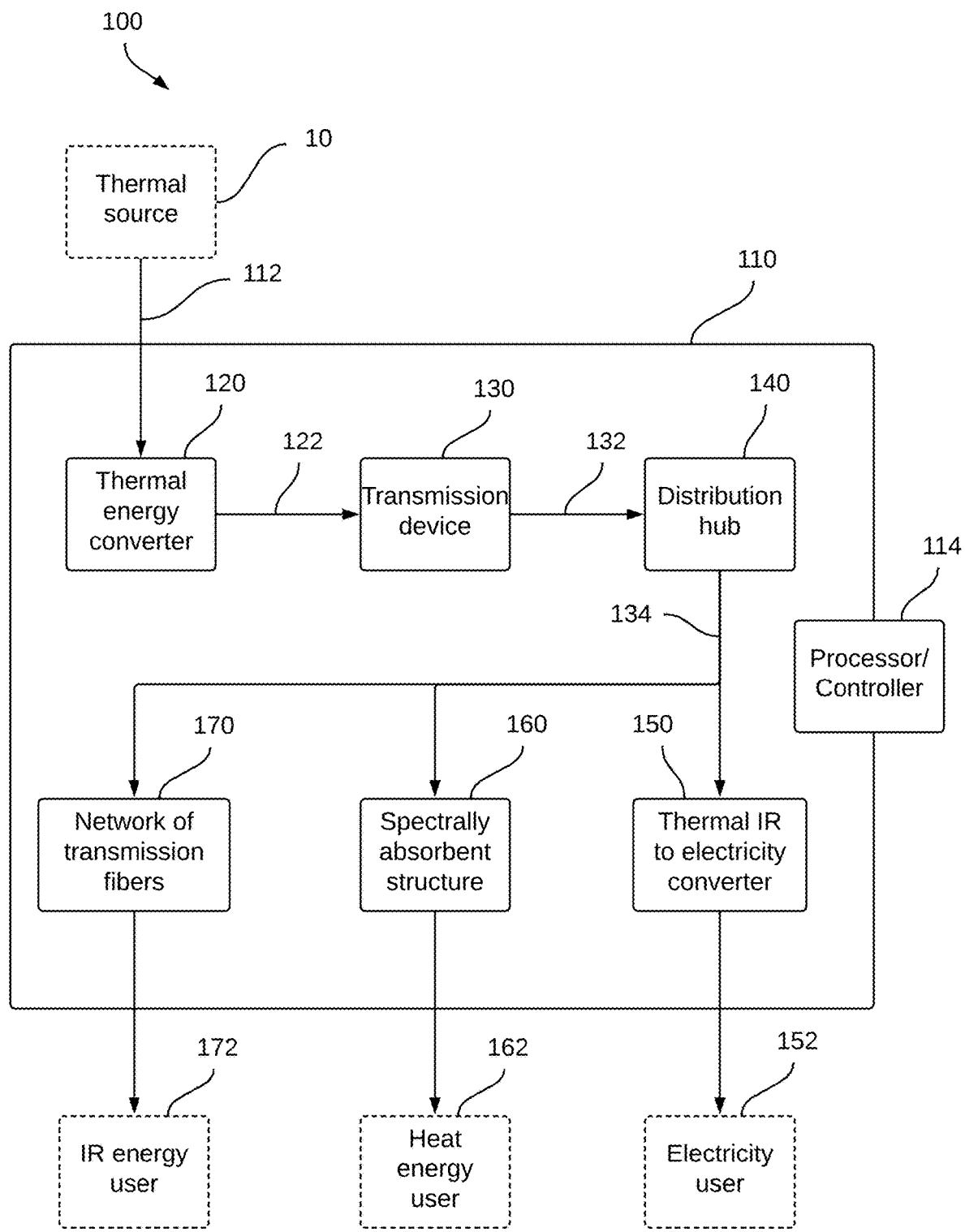
FIG. 1 is a representation of one embodiment of an energy conversion and transmission system.

Reference will now be made in detail to representative embodiments. The following descriptions are not intended to limit the embodiments to one preferred embodiment. To the contrary, the following disclosure is intended to cover alternatives, modifications, and equivalents as can be included within the spirit and scope of the described embodiments as defined, for example, by the appended claims.

The phrases "at least one," "one or more," and "and/or" are open-ended expressions which are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising", "including", and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The terms "determine," "calculate," "compute," and variations thereof, as used herein, are used interchangeably and include any type of methodology, process, mathematical operation or technique.

Portions of the disclosed methods and/or systems, e.g., the processor/controller 114, may be readily implemented in software and/or firmware that can be stored on a storage medium to improve the performance of: a programmed general-purpose computer with the cooperation of a controller and memory, a special purpose computer, a microprocessor, or the like. In these instances, the systems and methods can be implemented as program embedded on personal computer such as an applet, JAVA.RTM. or CGI script, as a resource residing on a server or computer workstation, as a routine embedded in a dedicated communication system or system component, or the like. The system can also be implemented by physically incorporating the system and/or method into a software and/or hardware system, such as the hardware and software systems of a communications transceiver.

Various embodiments may also or alternatively be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

The present disclosure relates generally to converting and transmitting energy. In an embodiment, a system and method to convert thermal blackbody radiation to thermal infrared (IR) energy includes forming a thermal IR energy stream and transmitting the thermal IR energy stream to a thermal IR energy destination, wherein the thermal IR energy stream may be converted to electricity. In another embodiment, thermal blackbody radiation is converted to thermal IR energy to form a thermal IR energy stream, the thermal IR energy stream transmitted to a thermal IR energy destination. In a further embodiment, the thermal IR energy stream is converted to electricity at the thermal IR energy destination.

The disclosed devices, systems, and methods of use will be described with reference to FIGS. 1-3. Although the disclosed devices, systems, and methods of use will be described relative to energy conversion and transmission involving blackbody thermal radiation energy and thermal IR energy in off-earth applications, the devices, systems, and methods of use have other applications. For example, the method and/or devices may be used in terrestrial applications. Other applications or uses are possible.

The present disclosure relates to the efficient transmission of energy from a thermal source to one or more remote end users. More specifically, the disclosure is an alternative to current art AC or DC electrical power transmission systems, comprising efficient conversion of spectrally broadband, non-coherent heat (aka "blackbody radiation") to near monochromatic, coherent far-infrared radiation, the transmission of that IR radiation via a low-loss dielectric waveguide assembly (aka a tuned fiber optic transmission path), and subsequent efficient conversion of the IR to electricity for utilization at one or more remote load sites. The method presented is especially advantageous compared with traditional electric power transmission and distribution, when employed in non-terrestrial (space, lunar or planetary) environments.

To overcome the limitations of current thermal-electric conversion and transmission systems, the system and method illustrated in herein are an enabling teaching of key embodiments of a novel system and method for converting and transmitting energy over significant distances. Those skilled in the relevant art will recognize that changes may be made to the embodiments described, while still obtaining significantly beneficial results.

The present disclosure describes various embodiments of a heat to light advanced conversion and transmission system (HELIACTS). HELIACTS technology converts thermal or solar energy into an infrared (IR) electromagnetic wave, then the IR beam is converted into electricity to be distributed to loads, users, and devices at various locations. The IR beam may be transmitted to specific locations using, for instance, optical waveguides. Alternatively, the IR beam may be converted to electricity then transmitted to desired locations for powering devices at remote locations. For instance, solar energy received at a spacecraft may be converted into a narrowband infrared beam, which is in turn concentrated and aimed at a bandgap-matched solar photovoltaic shielded within the body of the spacecraft to power the spacecraft operations; in such an embodiment, efficiencies up to 55% may be achieved with commercial, off-the-shelf solar cells, reducing cost and necessary mass for power generation.

FIG. 1 illustrates an energy conversion and transmission system 100, showing an exemplary embodiment of HELIACTS. The energy conversion and transmission system may be referred to simply as the "system," and the method of use of the energy conversion and transmission system may be simply referred to as the "method." Energy conversion and transmission system 100 may include a thermal energy converter 120 element, a transmission device 130, a distribution hub 140, a processor/controller 114, a thermal IR to electricity converter 150, a spectrally absorbent structure 160, and a network of transmission fibers 170.

Generally, energy conversion and transmission system 100 receives thermal blackbody radiation energy 112 from a thermal source 10 and converts thermal blackbody radiation energy 112 to a thermal IR energy stream 122 using thermal energy converter 120 device. Stated another way, thermal energy conversion device 120 receives thermal blackbody radiation energy 112 and converts thermal blackbody radiation energy 112 to thermal IR energy stream 122.

By way of providing additional background, context, and to further satisfy the written description requirements of 35 U.S.C. § 112, such as with respect to thermal energy conversion technology, the following references are incorporated by reference in entirety: Macroscopically Aligned Carbon Nanotubes as a Refractory Platform for Hyperbolic Thermal Emitters, Gao et al, *Physics and Optics,* 14 Mar. 2019.

Thermal IR energy stream 122 is received by transmission device 130 at a first location. Transmission device 130 transmits thermal IR energy stream 122 to a second location. As transmitted thermal IR energy stream 122 may undergo a change in state during transmission, e.g., power or frequency characteristics associated with thermal IR energy stream 122 may change, thermal IR energy stream 122 received at the first location (i.e., location of transmission device 130) may be termed a first thermal IR energy stream 122 and thermal IR energy stream output from transmission device 130 may be termed a second thermal IR energy stream 132.

By way of providing additional background, context, and to further satisfy the written description requirements of 35 U.S.C. § 112, such as with respect to thermal IR to electricity converter technology, the following references are incorporated by reference in entirety: Hollow-core Fibers for High Power Pulse Delivery, Michieletto et al, *Optical Society of America,* Vol. 24, No. 7, 4 Apr. 2016.

Second thermal IR energy stream 132 is received by distribution hub 140, which distributes or supplies or delivers an IR energy stream to one or more of the thermal IR to electricity converter 150, spectrally absorbent structure 160, and network of transmission fibers 170. As received second thermal IR energy stream 132 may also undergo a change in state at distribution hub 140, e.g., power or frequency characteristics associated with second thermal IR energy stream 132 may change, the output from distribution hub 140 may be termed a third thermal IR energy stream 144.

Thermal IR to electricity converter 150 receives thermal IR energy, such as a portion of third thermal IR energy stream 144, and converts received thermal IR energy to electrical energy 152. Electrical energy 152 is delivered or supplied to one or more electricity users 154.

Spectrally absorbent structure 160 receives thermal IR energy, such as a portion of third thermal IR energy stream 144, and converts the thermal IR energy to heat energy 162, which in turn is delivered or supplied to one or more heat energy users 164. Heat energy user 164 may be any user requiring heat, such as for use in heating an environmental enclosure or habitat.

Network of transmission fibers 170 receives thermal IR energy, such as a portion of third thermal IR energy stream 144, and distributes the thermal IR energy so received to one or more IR energy users 172. For example, network of transmission fibers 170 may distribute thermal IR energy by way of a multi-port splitter, thereby suppling thermal IR energy to a plurality of geographically dispersed user loads.

Processor/controller 114 may control one or more of the above-described elements of the energy conversion and transmission system 110. For example, processor/controller 114 may control the frequency and/or power characteristics of first thermal IR energy stream 122, second thermal IR energy stream 132, or third thermal IR energy stream 144.

Note that in some embodiments, distribution hub 140 element is absent and only one of thermal IR to electricity converter 150, spectrally absorbent structure 160, and network of transmission fibers 170 is implemented. Such embodiments present energy conversion and transmission system 100 embodiments that are dedicated to, respectively, delivery of electricity to one or more users 154, delivery of heat energy to one or more heat energy users 164, and delivery of IR energy to one or more IR energy users 174.

Figure 2:
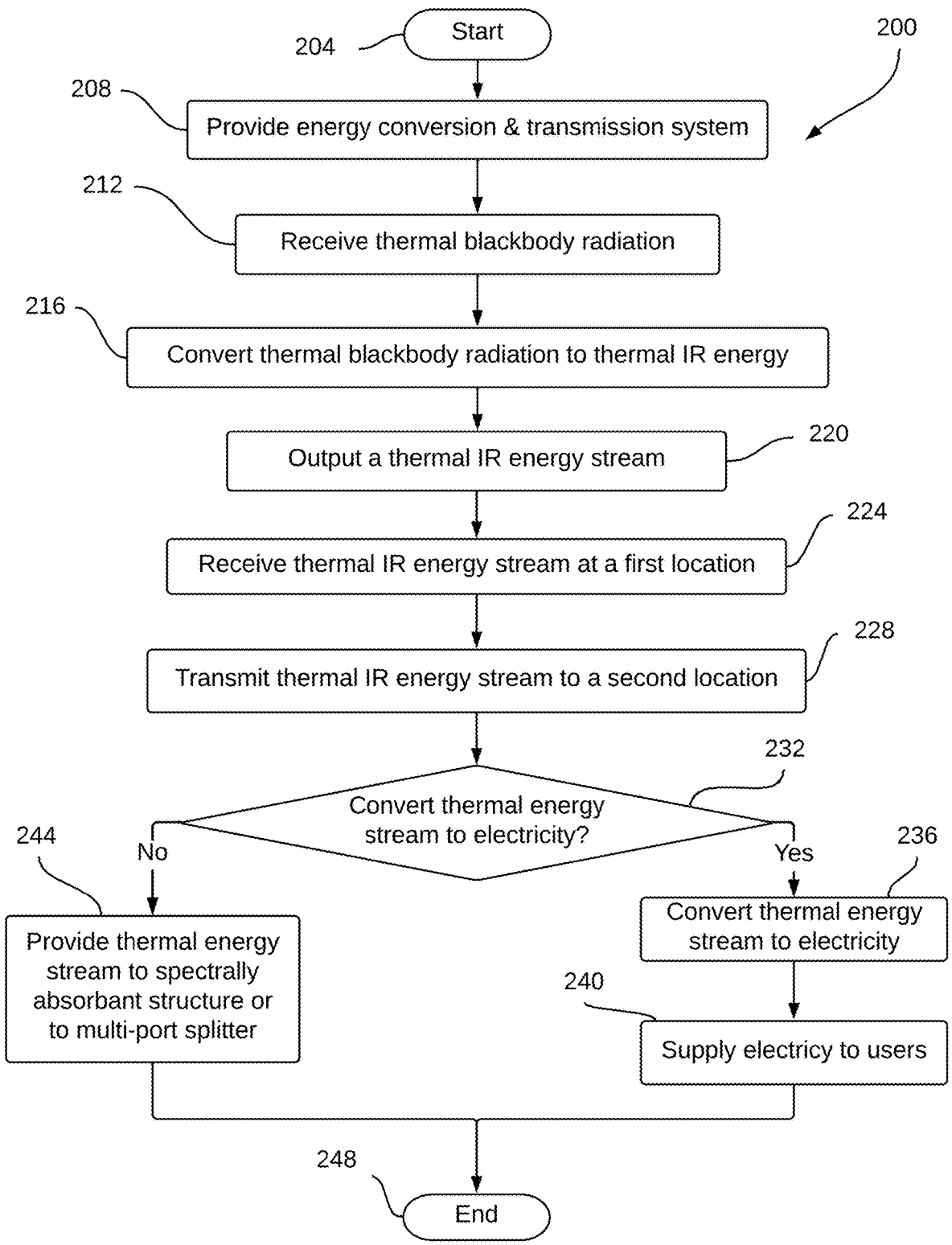
FIG. 2 illustrates a sequence of some steps of a method of use of the energy conversion and transmission system of FIG. 1.

FIG. 2 presents one embodiment of a method 200 of use of energy conversion and transmission system 100 of FIG. 1. It is noted that aspects and features of FIGS. 3 and 4 (described in detail below) may be referenced to enhance the disclosure of the method of use.

Generally, method 200 starts at a start step 204 and ends at an end step 248. Any of the steps, functions, and operations discussed herein can be performed continuously and automatically (such as, e.g., with aid or use of processor/controller 114). In some embodiments, one or more of the steps of method 200 may be performed using computer control, use of computer processors, and/or some level of automation (again, with aid or use of processor/controller 114). The steps are notionally followed in increasing numerical sequence although, in some embodiments, some steps may be omitted, some steps added, and the steps may follow other than increasing numerical order.

After starting at step 204, method 200 proceeds to a step 208 wherein an energy conversion and transmission system is provided. Method 200 then proceeds to a step 212, at which a thermal energy converter element or device (e.g., thermal energy converter 120 of FIG. 1) receives blackbody radiation (e.g., spectrally broadband, non-coherent heat), such as from thermal source 10 of FIG. 1. The thermal source may be, for instance, a reactor or other heat source.

Method 200 proceeds to a step 216, at which a thermal energy converter device, such as thermal energy converter 120 of FIG. 1, converts the received blackbody radiation to thermal IR energy (e.g., narrowband, near monochromatic, coherent IR energy). In one embodiment, the thermal energy converter device is a single-walled carbon nanotube (SWCNT) converter, as described below with respect to FIG. 3. Then, in a step 220, the thermal energy converter device outputs a thermal energy stream (e.g., first thermal IR energy stream 122 of FIG. 1).

At a step 224, a transmission device (e.g., transmission device 130 of FIG. 1), positioned or disposed with a receiving end at a first location, receives the thermal energy stream from the thermal energy converter device. In one embodiment, the transmission device is an IR dielectric waveguide, as described below with respect to FIG. 3.

At a step 228, the transmission device transmits the thermal energy stream to a second location. The second location may be, for instance, a transmitting end of the transmission device or adjacent to a distribution hub (e.g., distribution hub 140 of FIG. 1).

At a step 232, a query is made as to whether the thermal energy stream from the transmission device, is to be converted to electricity. If the response to the query is YES, method 200 proceeds to step 236 to convert the thermal energy stream to electricity using a thermal IR to electricity converter, such as thermal IR to electricity converter 150 of FIG. 1. In one embodiment, the thermal IR to electricity converter is an IR photocell array, as described below with respect to FIG. 3. Then, the electricity is distributed or supplied to one or more electricity users, such as electricity users 152 shown in FIG. 1.

By way of providing additional background, context, and to further satisfy the written description requirements of 35 U.S.C. § 112, such as with respect to thermal IR to electricity converter technology, the following references are incorporated by reference in entirety: Optimum Selective Emitters for Efficient Thermophotovoltaic Conversion, Hassan et al, *Appl. Phys. Lett.,* 116, 023903 (2020).

If the response to the query at step 232 is NO, then method 200 proceeds to a step 244, at which the thermal energy stream is provided or supplied to one or both of a spectrally absorbent structure and distributed to one or more heat energy users (e.g., spectrally absorbent structure 160 and heat energy user 164 of FIG. 1) or a network of transmission fibers and one or more IR energy users (e.g., network of transmission fibers 170 and IR energy user 174 of FIG. 1).

Following step 240 or 244, method 200 ends at end step 248.

Figure 3:
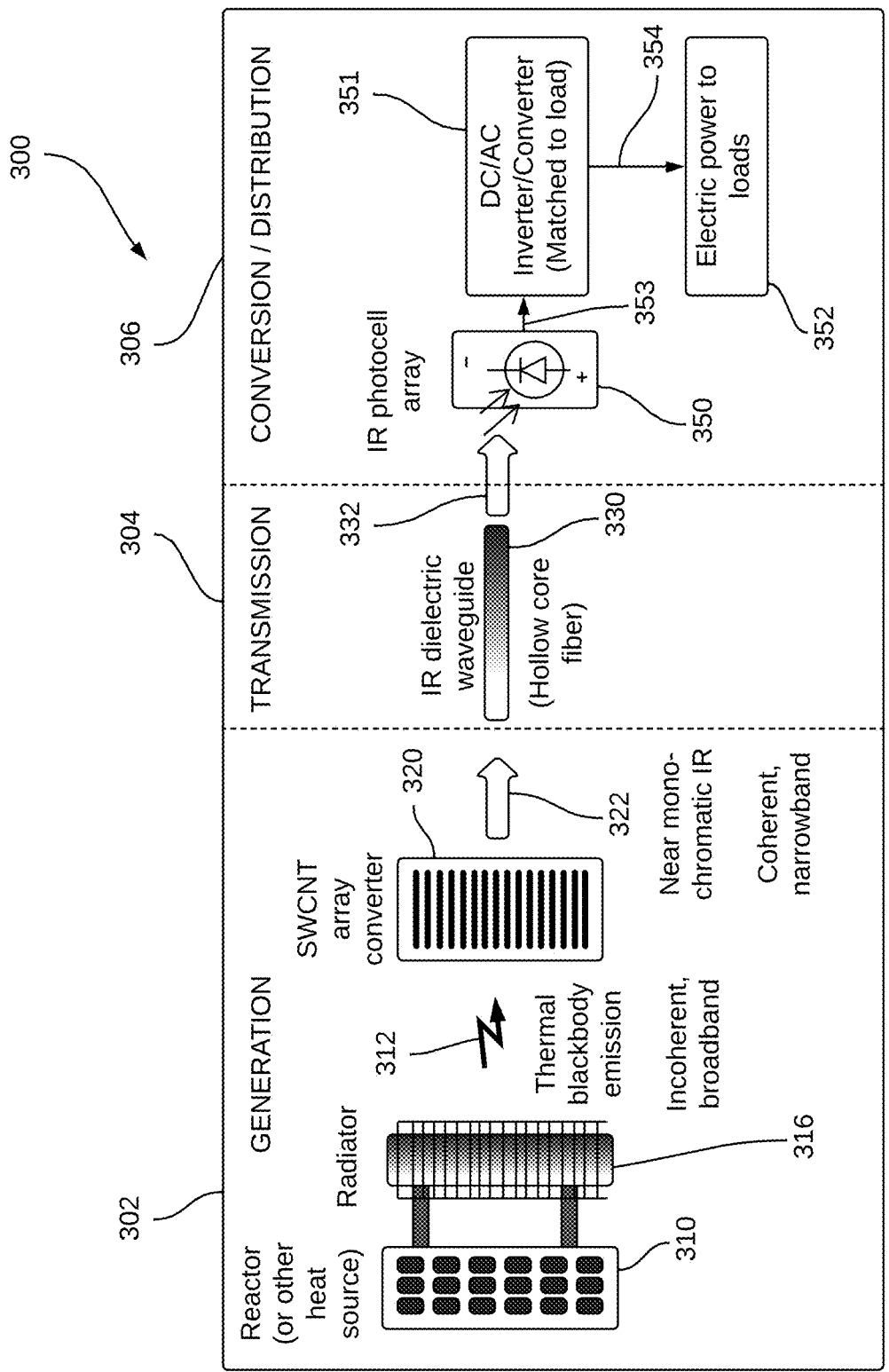
FIG. 3 is a representation of another embodiment of an energy conversion and transmission system.

FIG. 3 depicts an exemplary embodiment of an energy conversion and transmission system dedicated to delivery of electricity to one or more electric loads, users, or remote locations.

Generally, an energy conversion and transmission system 300 includes a generation block 302, a transmission block 304, and a conversion/distribution block 306. For instance, the various blocks within energy conversion transmission system 300 are configured to cooperate such that generation block 302 generates thermal energy and converts the thermal energy to a form of energy that may be transmitted, transmission block 304 provides transmission of the energy to conversion/distribution block 306, then conversion/distribution block 306 provides the transmitted energy to specific devices or users.

As an example, generation block 302 includes a reactor or other heat source 310, which emits heat to a radiator 316. Optionally, heat source 310 may be thermally connected with radiator 316 using a heat tube or other thermally conductive device, or heat may be radiatively transmitted from heat source 310 to radiator 316. Radiator 316 emits blackbody radiation 312, which is received by a thermal energy converter 320. In an embodiment, thermal energy converter 320 is a solid-state narrowband frequency selective emitter/converter, such as a SWCNT array converter or a metamaterial emitter (such as described in Chirumamilla, M., Krishnamurthy, G.V., Knopp, K. et al. Metamaterial emitter for thermophotovoltaics stable up to 1400° C. Sci Rep 9, 7241 (2019). https://doi.org/10.1038/s41598-019-43640-6 accessed 2022, Mar. 8). In such a case, thermal energy converter 320 emits near monochromatic IR energy 322, which may also be coherent, narrowband infrared radiation, to a transmission device 330. Transmission device 330 may be implemented as an IR dielectric waveguide, such as a solid state waveguide or a hollow core fiber, for example. Transmission device 330 within transmission block 304 delivers transmitted IR energy 332 from generation block 302 to a thermal IR to electricity converter 350 in conversion/distribution block 306. In an example, thermal IR to electricity converter 350 may be implemented as an IR photocell array in combination with a DC/AC inverter/converter 351, which then delivers electric power to loads, users, or remote locations 352. In the present example, the thermal IR to electricity converter outputs electricity 353 to DC/AC inverter/converter 351, which then distributes the resulting electric power 354 to loads 352. For instance, the capacity of DC/AC inverter/converter 351 may be matched to the specific needs of electricity loads 352.

In other words, in energy conversion and transmission system 300, broadband, non-coherent thermal energy (i.e., blackbody radiation) is sourced from a blackbody thermal emitter (i.e., reactor 310 and radiator 316), then converted to narrowband, coherent far-infrared (i.e., thermal IR) radiation 322 by using a solid-state, narrowband, frequency-selective emitter/converter. Alternative embodiments may employ other selective emitter structures, such as Tamm plasmon polariton metamaterial structures incorporated in resonant cavities, as may be dictated by specific operating environments or applications. The narrowband output from the SWCNT array converter is directed to the transmission device, such as an IR dielectric waveguide and/or IR fiber optics, which then transmits the narrowband IR energy to a remote user conversion/distribution site. Some examples of IR fiber optics that may be suitable for the present application are: 1) Anti Resonant, Hollow-Core (ARHC) fiber; 2) hollow-core photonic crystal fiber; 3) Large-area mode photonic crystal fiber; and 4) Multi-mode fiber (such as those typically used for transmitting high-powered laser beams).

In this representative embodiment of the system, a dielectric waveguide configuration, such as anti-resonant hollow core, may be utilized to secure extremely low-loss transmission of the thermal IR energy in transmission block 304. Anti-resonant hollow core fibers have been demonstrated to have losses of less than 0.65 dB/km of length, regardless of input power level, up to the point of mechanical fiber breakdown. This feature may be advantageous compared with the extant art in conductive electrical power transmission. Alternate embodiments may utilize other dielectric waveguide or fiber optic configurations, such as photonic crystal hollow core geometries, as may be dictated by specific operating environments or conditions. Then, upon exiting transmission block 304, the transmitted IR energy is coupled to a tuned Infrared photovoltaic cell array, whereupon it is efficiently converted to DC (or alternately, AC) electricity for local application to user electric loads 35. This conversion of spectrally narrow-band energy can be matched to the band-gap of the photovoltaic elements, resulting in conversion efficiencies approaching 90%.

With existing art, conductive transmission line losses are a function of input current as well as conductor geometry and length and will increase for a given geometry as more and more power are conveyed. Additionally, losses due to "corona," i.e., ionization of gas molecules in the vicinity of conductive transmission lines, serve to limit the voltage at which these lines may operate. While not a significant problem in deep-space vacuum, the lower density of gas, often carrying highly charged dust particles, in planetary atmospheres (such as that of Mars) facilitates ionization at significantly lower voltages. These considerations would require that conductive transmission lines on Mars operate at significantly reduced voltage compared with terrestrial systems, thus increasing operating current for a given power, resulting in correspondingly larger resistive losses. In fact, the minimum potential (voltage) that supports ionization and corona breakdown (i.e., arcing) for $CO_2$ happens to occur at pressures equivalent to nominal Martian atmospheric pressure (5-7 mm Hg). Thus, the ability to use conventional high voltage electric power transmission on the Martian surface is severely constrained. Since the mechanism of energy transfer is fundamentally different from that employed in a conductive electric system, the embodiments described herein does not suffer from the same limitation and may be used in such challenging conditions as in non-earth, planetary atmospheres.

Figure 4:
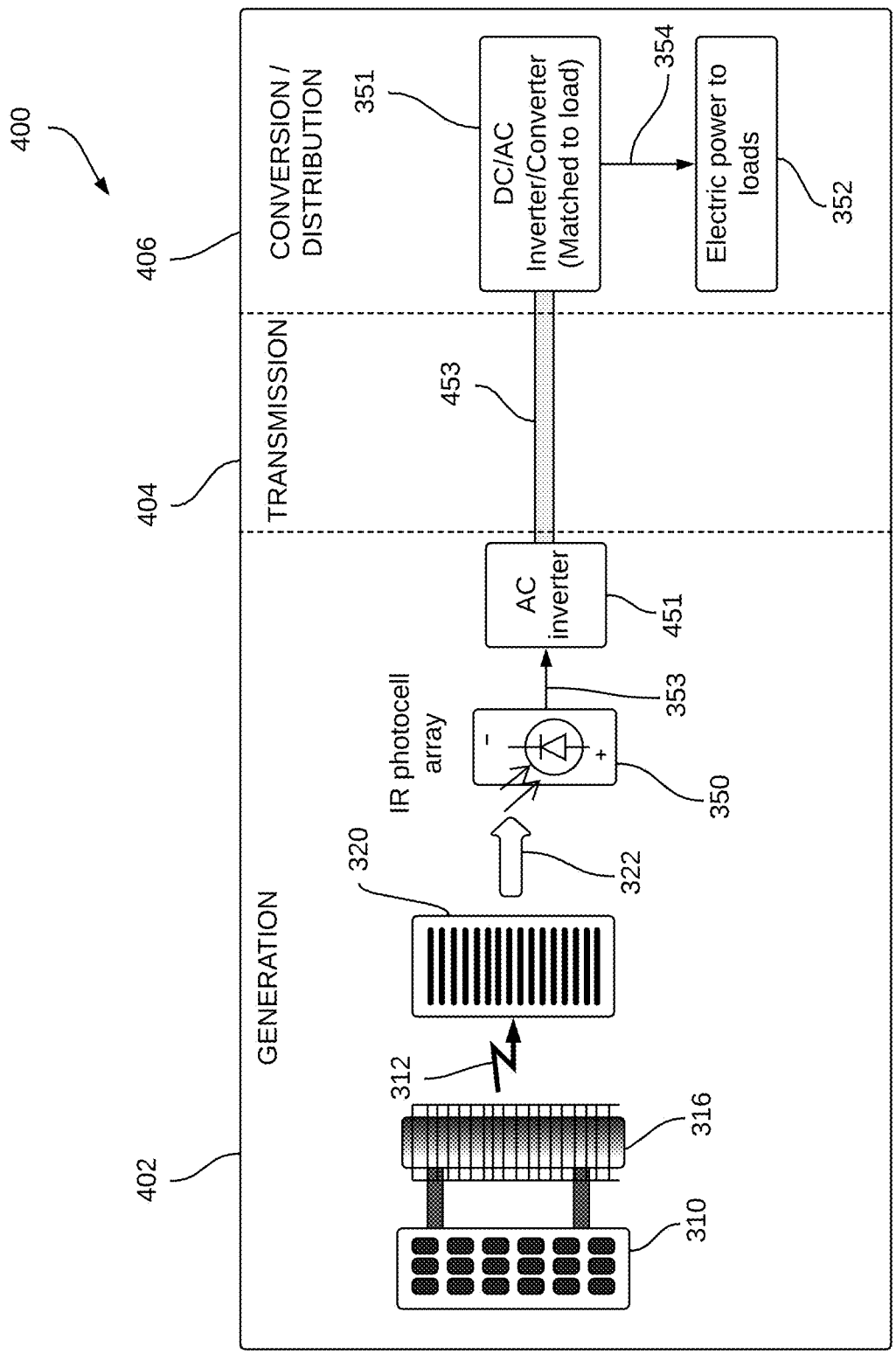
FIG. 4 illustrates an alternative embodiment an energy conversion and transmission system.

Alternate embodiments of the same process facilitate efficient energy transmission and distribution upon or within a large spaceborne structure (e.g., spacecraft or space station). Additional alternate embodiments would enable more efficient terrestrial (earth-based) energy transmission and distribution. For example, FIG. 4 illustrates another embodiment of an energy conversion and transmission system 400. As shown in FIG. 4, a generation block 402 incorporates the same component as generation block 302 as that shown in FIG. 3. Additionally, energy conversion and transmission system also includes a transmission block 404 and a conversion/distribution block 406. Generation block 402 incorporates thermal IR to electricity converter 350 therein in order to take advantage of the proximity to the IR source for efficient electricity conversion. The resulting electricity 353 is received at an AC inverter 451 to be converted from a DC current to AC and directed to transmission block 404. Transmission block 404 includes a transmission line 453 configured for electrical transmission rather than optical infrared transmission. In an example, transmission line 453 is a low mass carbon nanotube (CNT) conductor transmission line or another low-mass, non-metallic transmission line. Once the AC transmission is received via transmission line 453, conversion/distribution block 406 then directs the received electricity via DC/AC inverter/converter 351 to be distributed to loads.

While the example illustrated in FIG. 3 takes advantage of the well established technologies for IR transmission over long distances, the example of FIG. 4 allows high efficiency thermal to IR conversion near the source of the thermal energy, which may be preferable in certain instances. For instance, the proximity of the generation block and the loads as well as the transmission conditions (e.g., tens of inches in a satellite or space craft installation rather than over several hundred yards in a space station application) may be considered in selecting between the exemplary embodiments illustrated in FIGS. 3 and 4.

It is noted that the HELIACTS technology described herein can provide efficient, globally optimal power generation and transmission in a variety of environments. Efficient thermal blackbody conversion to narrowband IR radiation, efficient narrowband conversion to electricity, and efficient transmission tailored for specific load requirements provide advantages heretofore unavailable in existing technologies. Further, HELIACTS is compatible with traditional power conversion and transmission, including hybrid implementations combining traditional power generation and portions of HELIACTS power generation and distribution. For example, HELIACTS may be combined with traditional electromechanical or thermoelectric conversion schemes.

Figure 5:
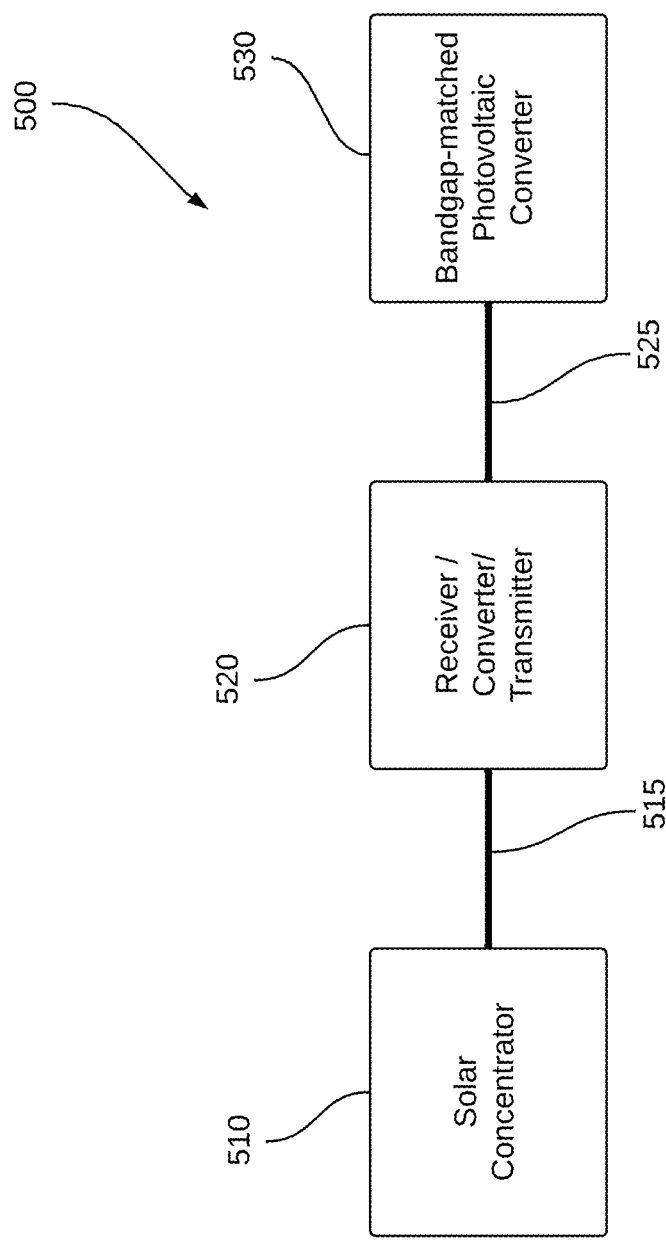
FIG. 5 shows building blocks of a heat to light advanced conversion and transmission system (HELIACTS), in accordance with an embodiment.

FIG. 5 illustrates essential components of a HELIACTS in a solar-powered implementation, in accordance with an embodiment. As shown in FIG. 5, a HELIACTS arrangement 500 includes a solar concentrator 510, which receives sunlight and focuses it into a concentrated solar beam 515. Solar beam 515 is directed onto a receiver/converter/transmitter (RCT) 520, which in turn converts the received solar energy into an IR beam 525 to be transmitted to a bandgap-matched photovoltaic converter (PVC) 530. Bandgap-matched PVC 530 then converts the received IR beam into electricity. The wavelength of IR beam 525 is substantially matched (e.g., to within 10 to 20%) to a bandgap wavelength of PVC 530. Bandgap-matched PVC 530 may be located in proximity to RCT 520, or be located some distance away such that IR beam 525 is contained and transmitted via a waveguide.

As an example, solar concentrator 510 may be a parabolic trough concentrator, a linear Fresnel collector, a concentrating dish, or another solar concentrator mechanism for focusing sunlight onto RCT 520. As an example, RCT 520 may be a cylindrical composite structure including an outer surface selective absorber element mounted on a portion of the cylinder facing a solar concentrator reflector, and a carbon nanotube selective emitter (SE) bonded to an inner wall of a substrate. In such an embodiment, the absorber affortds efficient broadband collection of solar energy incident on its surface. The SE emits thermal IR in a narrow band of wavelengths (e.g., around 1.5 microns), which is matched to the bandgap energy wavelength of thermal photovoltaic cells incorporated into PVC 530. In an embodiment, a layer of a reflective material, such as gold, may be deposited on an inner wall opposite the SE to act as a reflector, confining narrowband thermal IR to the interior of the cylinder of solar concentrator 510. An endcap on the outboard RCT may also be reflective. The inboard interface of RCT 520 couples the IR beam from the RCT to, for example, a spacecraft bus through a rotational interface in a manner similar to a solar array drive mechanism, although without a need for slip rings or contacts. Lenses and other optical elements may be used to collimate and concentrate IR beam 525 to efficiently convey the beam onto PVC 530. Optionally, diffuser optics may be used to shape the profile of IR beam 525 to uniformly illuminate the solar cell array in PVC 530. Ideally, the wavelength of IR beam 525 and the bandgap of the photovoltaics in PVC 530 are matched to maximize the quantum efficiency with minimal energy losses in the IR photons to free electrons conversion. In this way, the power generation is maximized, while reducing the waste heat produced, thus enabling the incorporation of HELIACTS within the body of a spacecraft without a need for a large radiating surface. Further, with the sensitive PVC shielded within the spacecraft body, HELIACTS is inherently robust to high energy particle radiation, particularly operating at or near beginning of life efficiency for the spacecraft's lifetime, even with frequent or prolonged transits through the Van Allen radiation belts.

Figure 6:
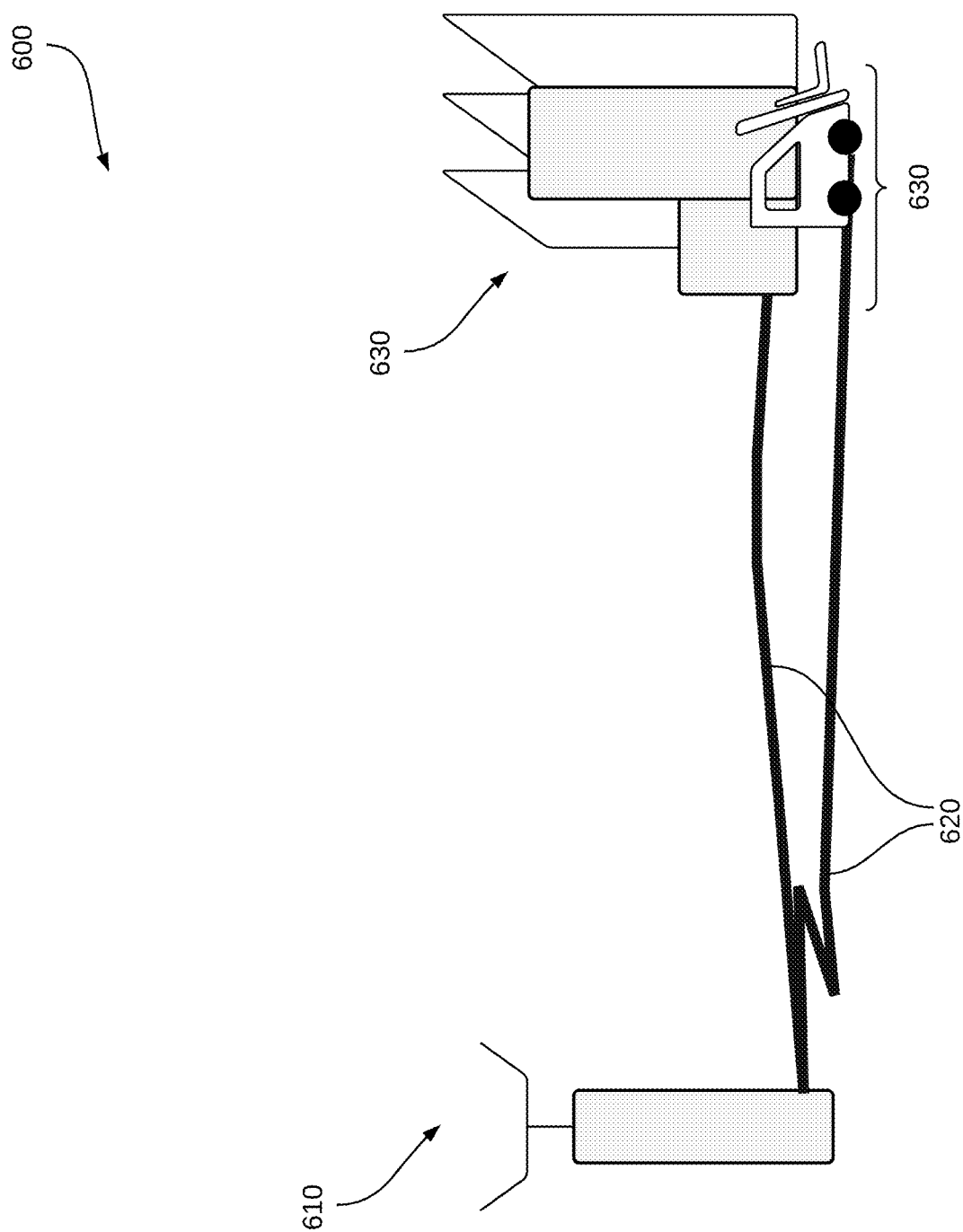
FIG. 6 shows an implementation of HELIACTS technology in a space station context, in accordance with an embodiment.

As an example, FIG. 6 shows a ground implementation of a HELIACTS 600, including a thermal power source 610, transmission lines 620, and a converter 630. Thermal power source 610 includes, for example, solar concentrator 510 and RCT 520, such as the combination of a thermal power source with a narrowband selective emitter. In an embodiment, thermal power source 610 generates power in the form of IR radiation, and no other conversion technology is needed at thermal power source 610. Transmission lines 620 (e.g., IR-guiding optical fibers) perform power transmission as narrowband longwave IR, such as using anti-resonant hollow core fibers. Then, the IR radiation from transmission lines 620 is converted to DC or AC electrical power at converter 630 using, for example, IR photovoltaics. The conversion may be performed at a central location, then the power distributed to specific loads, or transmission lines 620 may transmit the IR beam to the load such that the conversion may take place at the load.

Figure 7:
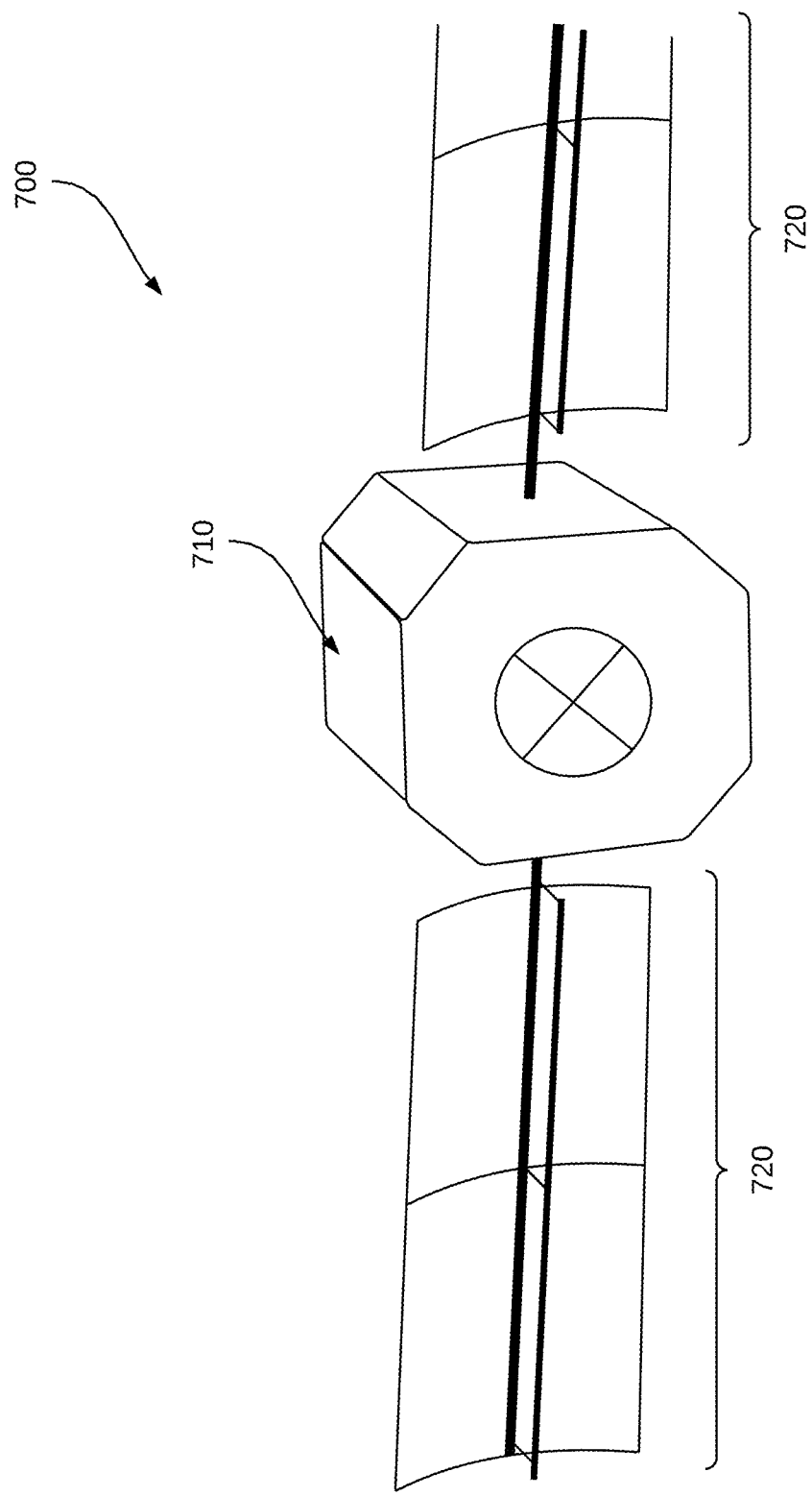
FIG. 7 shows an implementation of HELIACTS technology in place of a traditional solar panel system for a satellite or spacecraft, in accordance with an embodiment.

FIG. 7 shows a spacecraft implementation of a HELIACTS 700, which provides power to a spacecraft body 710, generated at HELIACTS 720. Such an embodiment may be a high efficiency substitute for a traditional spacecraft solar power generator system.

Figure 8:
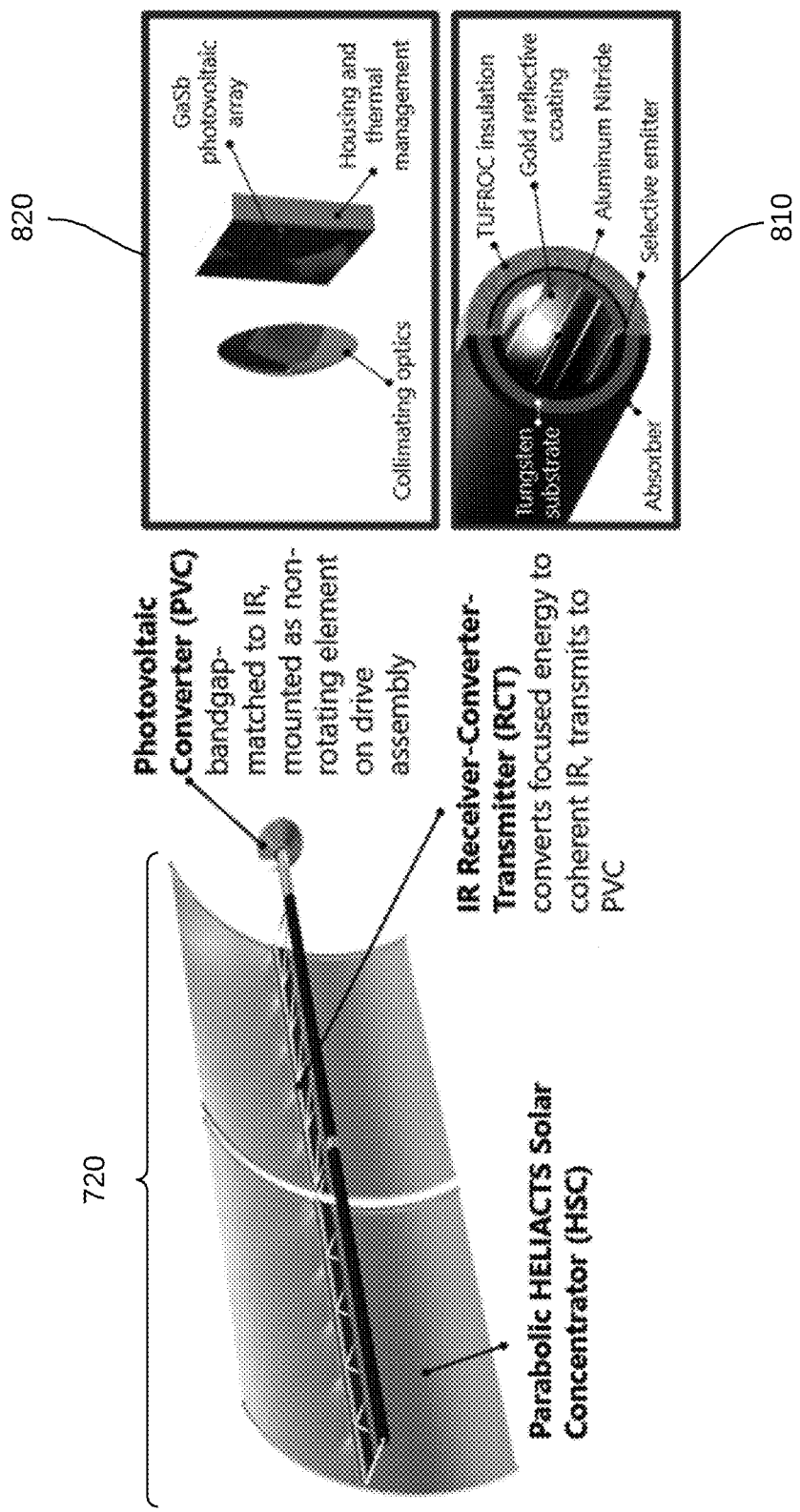
FIG. 8 illustrates further details of an exemplary HELIACTS embodiment suitable for use with a satellite or spacecraft, in accordance with an embodiment.

Further details of HELIACTS 720 of FIG. 7 are illustrated in FIG. 8. As shown in FIG. 8, HELIACTS 720 uses thermal energy provided by concentrated sunlight to generate power for the spacecraft. The solar collectors may be reflective or refractive (such as parabolic mirrors or lenses). In an example, the concentrated sunlight heats a carbon nanotube (CNT) selective emitter. The resulting narrow-band IR is transmitted to the PV-cells for conversion to electric current.

Continuing to refer to FIG. 8, a parabolic trough reflector (labeled "Parabolic HELIACTS Solar Concentrator (HSC)" in the figure) focuses sunlight onto an absorber (i.e., a dark material with low emissivity) at the focal line, such as incorporated into the IR Receiver-Converter-Transmitter (RCT) shown in FIG. 8. IR RCT of FIG. 8 may be mounted, for example, on slit-tube booms, such as developed by Opterus. As further illustrated in inset 810, the RCT tube at the focal line has layers to absorb light on one side (e.g., the absorber mounted on a tungsten substrate in inset 810), and insulation material on the side facing away from the reflector (e.g., Toughened Uni-piece Fibrous Reinforced Oxidation-Resistant Composite (TUFROC) available for license from NASA), thus converting the sunlight energy focused thereon into coherent IR and transmits the resulting IR beam toward a photovoltaic converter (PVC). In the example shown in FIG. 8, the PVC is located at an end of the RCT tube, and may be housed within the body of a spacecraft, such as spacecraft body 710 of FIG. 7. The interior of the RCT tube, also shown in inset 810, has a CNT selective emitter on the heated side, and reflective gold coating on an aluminum nitride base on the opposite side to help transmit the IR generated to the end of the tube. Additional optics, such as collimating optics shown in inset 820, may facilitate coupling of the transmitted IR radiation to fiber for further transmission such that the conversion of IR to electricity happens in another location (e.g., inside a spacecraft). The PVC includes a photovoltaic array (e.g., gallium-antimony (GaSb) photovoltaic array) contained within a housing including thermal management features and optional collimating optics.

Figure 9:
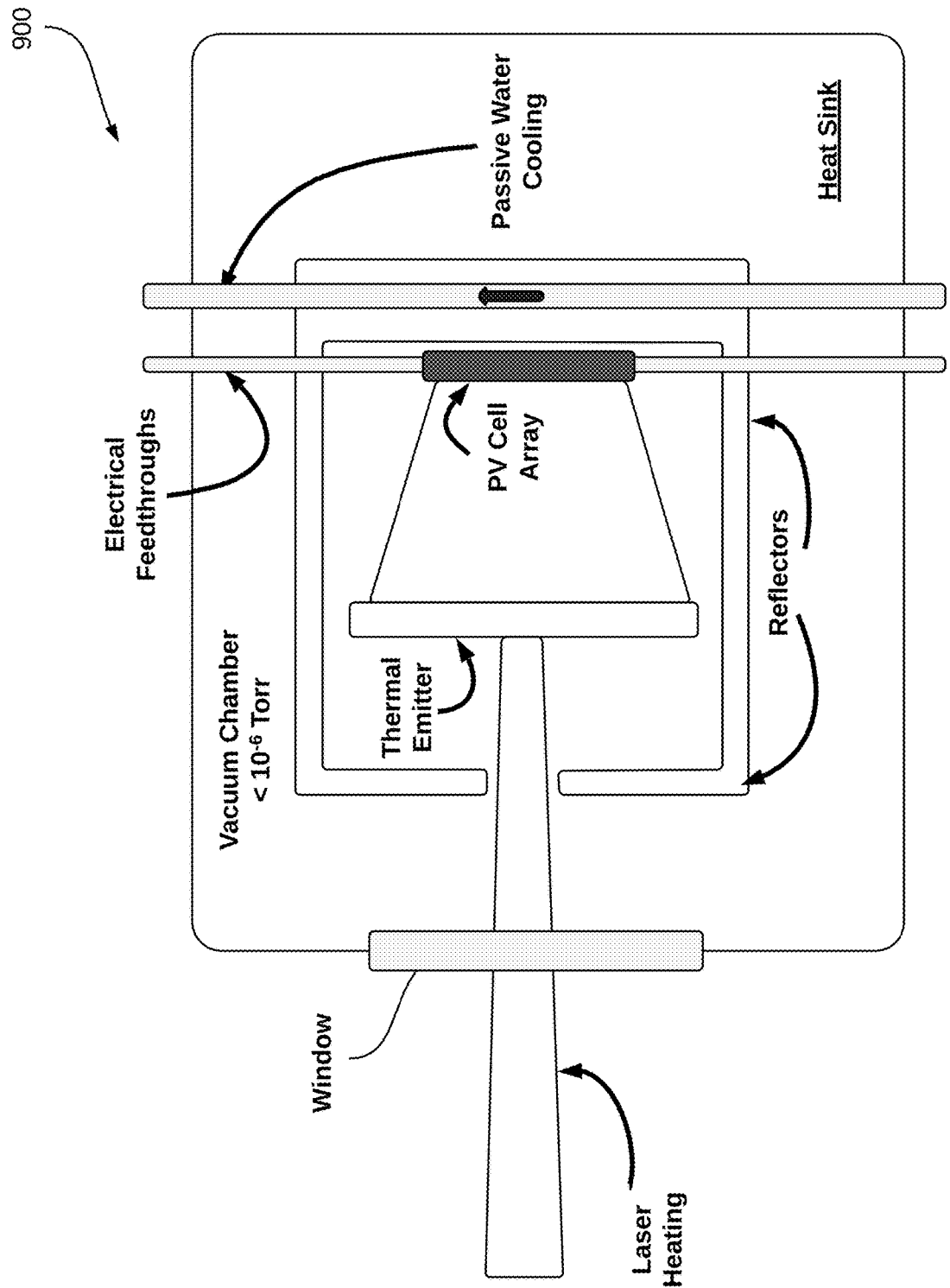
FIG. 9 is a diagram showing an exemplary embodiment of a thermo photovoltaic (TPV) conversion system suitable for use with HELIACTS technology in certain applications.

FIG. 9 illustrates an exemplary embodiment of a PVC suitable for use within a HELIACTS implementation. As shown in FIG. 9, PVC 900 includes a PV cell array mounted within a housing, which integrates a copper heat sink and copper reflectors within a vacuum chamber operating at, for example, less than $10^{-6}$ Torr. Optionally, the housing further incorporates passive water cooling to help with the thermal management of any excess heat generated by the PV cell array. When an IR beam (labeled as "laser heating" in the figure) is incident on the PV cell array through a window in the vacuum chamber, the incident IR energy is converted to electrical energy, which is directed away from the PVC via electrical feedthroughs. It is noted that variations from the PVC design illustrated in FIG. 9 are possible without straying from the spirit of the embodiment described herein.

Note that other methods of use of the disclosed energy conversion and transmission system. Also, any of the steps, functions, and operations discussed herein can be performed continuously and automatically. In some embodiments, one or more of the steps of the method of use may comprise computer control, use of computer processors, and/or some level of automation. The steps disclosed may notionally followed in the order disclosed, although, in some embodiments, some steps may be omitted, some steps added, and the steps may follow other than increasing numerical order.

The exemplary systems and methods of this disclosure have been described in relation to systems and methods involving an energy conversion and transmission system.

However, to avoid unnecessarily obscuring the present disclosure, the preceding description omits a number of known structures and devices, and other application and embodiments. This omission is not to be construed as a limitation of the scopes of the claims. Specific details are set forth to provide an understanding of the present disclosure. It should however be appreciated that the present disclosure may be practiced in a variety of ways beyond the specific detail set forth herein.

A number of variations and modifications of the disclosure can be used. It would be possible to provide for some features of the disclosure without providing others.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein, and other similar standards and protocols not mentioned herein are periodically superseded by faster or more effective equivalents having essentially the same functions. Such replacement standards and protocols having the same functions are considered equivalents included in the present disclosure.

The present disclosure, in various aspects, embodiments, and/or configurations, includes components, methods, processes, systems and/or apparatus substantially as depicted and described herein, including various aspects, embodiments, configurations embodiments, sub-combinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. An energy conversion and transmission system comprising:
   a thermal energy converter configured to convert thermal blackbody radiation energy to thermal infrared (IR) energy and to output a thermal IR energy stream; and
   a transmission device configured to receive the thermal IR energy stream from the thermal energy converter at a first location and output the thermal IR energy stream at a second location,
   wherein the transmission device supplies the thermal IR energy stream to a thermal IR energy destination at the second location, and
   wherein the thermal energy converter comprises a single wall carbon nanotube structure.

2. The system of claim 1, further comprising a controller configured to direct the thermal IR energy stream to one of a set of selectable thermal energy destinations.

3. The system of claim 1, wherein the thermal IR energy destination is a thermal IR to electricity converter configured to convert thermal IR energy to AC electricity or DC electricity.

4. The system of claim 3, wherein the thermal IR to electricity converter is an IR photocell array.

5. The system of claim 1, wherein the thermal IR energy destination is a heat energy user.

6. The system of claim 1, wherein the thermal IR energy destination is an IR energy user.

7. The system of claim 1, wherein the thermal energy converter is a metamaterial structure comprising a resonant cavity, the resonant cavity comprising an integral Tamm plasmon polariton metamaterial structure.

8. The system of claim 1, wherein the thermal IR energy destination is a multi-port splitter configured to supply thermal IR energy to a plurality of users.

9. The system of claim 1, wherein the thermal IR energy destination is a spectrally absorbent structure configured to output thermal energy.

10. A method of converting and transmitting energy comprising:
   providing an energy conversion and transmission system including
     a thermal energy converter including one of a single wall carbon nanotube structure and a meta material structure with a resonant cavity, the resonant cavity including an integral Tam plasmon polariton metamaterial structure, the thermal energy converter being configured to receive thermal blackbody radiation energy, convert the thermal blackbody radiation energy to thermal IR energy, and output a thermal IR energy stream, and
     a transmission device configured to receive the thermal IR energy stream from the thermal energy converter at a first location and output the thermal IR energy stream at a second location;
   receiving, by the thermal energy converter from a thermal energy source, thermal blackbody radiation energy;

converting, by the thermal energy converter, the thermal blackbody radiation energy to thermal IR energy to produce a thermal IR energy stream;

transmitting, by the transmission device, the thermal IR energy stream from a first location to a second location; and supplying the thermal IR energy stream is to a thermal IR energy destination at the second location.

11. An energy conversion and transmission system comprising:

a thermal energy converter configured to convert thermal blackbody radiation energy to thermal infrared (IR) energy and to output a thermal IR energy stream; and a transmission device configured to receive the thermal IR energy stream from the thermal energy converter at a first location and output the thermal IR energy stream at a second location, wherein the transmission device supplies the thermal IR energy stream to a thermal IR energy destination at the second location, and wherein the thermal energy converter is a metamaterial structure comprising a resonant cavity, the resonant cavity comprising an integral Tamm plasmon polariton metamaterial structure.

12. The system of claim 11, further comprising a controller configured to direct the thermal IR energy stream to one of a set of selectable thermal energy destinations.

13. The system of claim 11, wherein the thermal IR energy destination is a thermal IR to electricity converter configured to convert thermal IR energy to AC electricity or DC electricity.

14. The system of claim 13, wherein the thermal IR to electricity converter is an IR photocell array.

15. The system of claim 11, wherein the thermal IR energy destination is a heat energy user.

16. The system of claim 11, wherein the thermal IR energy destination is an IR energy user.

17. The system of claim 11, wherein the thermal energy converter comprises a single wall carbon nanotube structure.

18. The system of claim 11, wherein the thermal IR energy destination is a multi-port splitter configured to supply thermal IR energy to a plurality of users.

19. The system of claim 11, wherein the thermal IR energy destination is a spectrally absorbent structure configured to output thermal energy.

* * * * *